(12) United States Patent
Fujii et al.

(10) Patent No.: US 10,535,473 B2
(45) Date of Patent: Jan. 14, 2020

(54) CAPACITOR AND CAPACITOR MOUNTING CONFIGURATION

(71) Applicant: Murata Manufacturing Co., Ltd., Nagaokakyo-shi, Kyoto-fu (JP)

(72) Inventors: Yasuo Fujii, Nagaokakyo (JP); Naoki Iwaji, Nagaokakyo (JP)

(73) Assignee: MURATA MANUFACTURING CO., LTD., Nagaokakyo-Shi, Kyoto-Fu (JP)

(*) Notice: Subject to any disclaimer, the term of this patent is extended or adjusted under 35 U.S.C. 154(b) by 0 days.

(21) Appl. No.: 16/411,370

(22) Filed: May 14, 2019

(65) Prior Publication Data

US 2019/0267188 A1 Aug. 29, 2019

Related U.S. Application Data

(63) Continuation of application No. PCT/JP2017/040775, filed on Nov. 13, 2017.

(30) Foreign Application Priority Data

Nov. 16, 2016 (JP) .................. 2016-223415

(51) Int. Cl.
*H01G 11/24* (2013.01)
*H05K 1/18* (2006.01)
(Continued)

(52) U.S. Cl.
CPC ........... *H01G 11/24* (2013.01); *H01G 4/0085* (2013.01); *H01G 4/01* (2013.01); *H01G 4/228* (2013.01);
(Continued)

(58) Field of Classification Search
CPC ........... H01G 11/24; H01G 2009/0412; H01G 2009/0416; H05K 1/181
See application file for complete search history.

(56) References Cited

U.S. PATENT DOCUMENTS

2004/0095710 A1  5/2004  Miki et al.
2012/0293918 A1  11/2012  Uchiyama et al.
(Continued)

FOREIGN PATENT DOCUMENTS

JP  2001185460 A  7/2001
JP  2003045762 A  2/2003
(Continued)

OTHER PUBLICATIONS

International Search Report issued for PCT/JP2017/040775, dated Feb. 6, 2018.
(Continued)

*Primary Examiner* — Jeremy C Norris
(74) *Attorney, Agent, or Firm* — Arent Fox LLP

(57) ABSTRACT

A capacitor that includes a conductive metal base member having a porous portion in a first main surface, a dielectric layer that entirely covers the first main surface and entirely covers side surfaces disposed along a direction orthogonal to the first main surface, an electrode layer covering the dielectric layer, a second extended electrode covering the electrode layer, a first extended electrode covering a second main surface of the conductive metal base member opposite the first main surface, and an insulation layer that insulates the electrode layer and the conductive metal base member from each other.

18 Claims, 10 Drawing Sheets

(51) Int. Cl.
*H01G 4/008* (2006.01)
*H01G 4/01* (2006.01)
*H01G 4/228* (2006.01)
*H01G 9/04* (2006.01)

(52) U.S. Cl.
CPC ............ *H05K 1/181* (2013.01); *H05K 1/182* (2013.01); *H01G 2009/0412* (2013.01); *H05K 2201/10015* (2013.01)

(56) References Cited

U.S. PATENT DOCUMENTS

| | | | |
|---|---|---|---|
| 2015/0207148 A1* | 7/2015 | Kimura | H01M 4/622 429/199 |
| 2016/0284476 A1 | 9/2016 | Paulus et al. | |
| 2016/0329158 A1 | 11/2016 | Hattori et al. | |

FOREIGN PATENT DOCUMENTS

| | | |
|---|---|---|
| JP | 2003142347 A | 5/2003 |
| JP | 2011243864 A | 12/2011 |
| JP | 2012243783 A | 12/2012 |
| JP | 2016181692 A | 10/2016 |
| WO | 2015118901 A1 | 8/2015 |

OTHER PUBLICATIONS

Written Opinion of the International Searching Authority issued for PCT/JP2017/040775, dated Feb. 6, 2018.

* cited by examiner

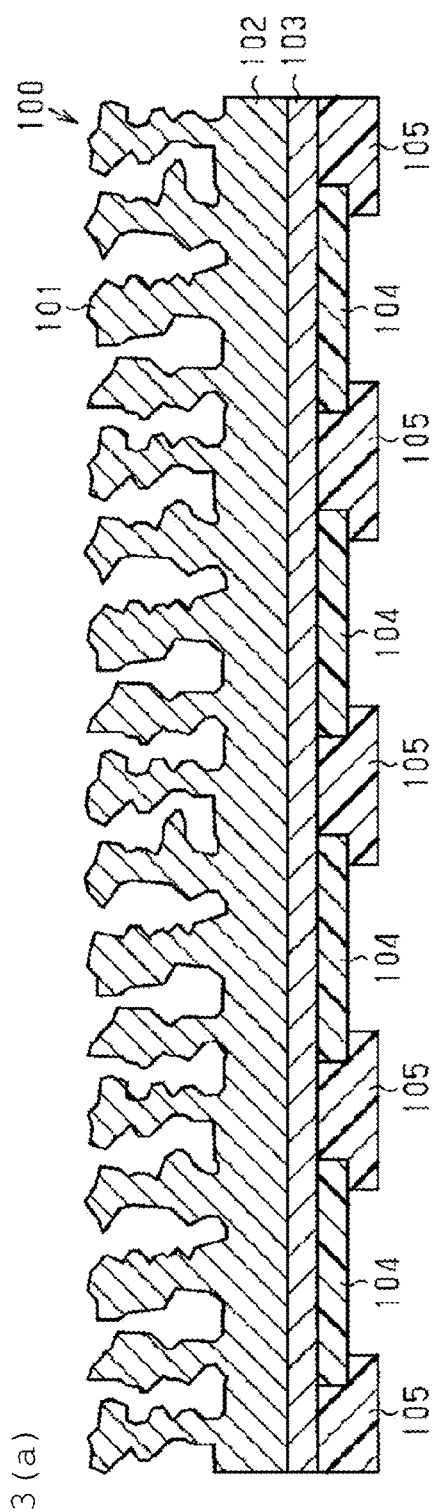
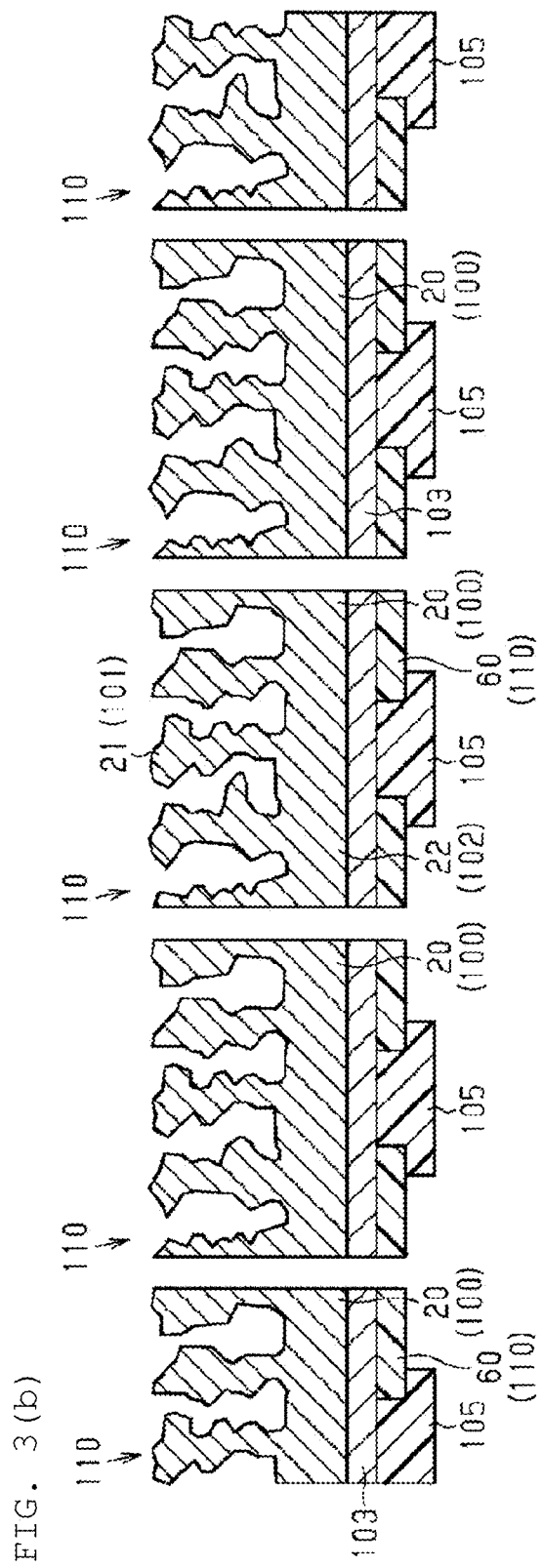
FIG. 3(a)
FIG. 3(b)

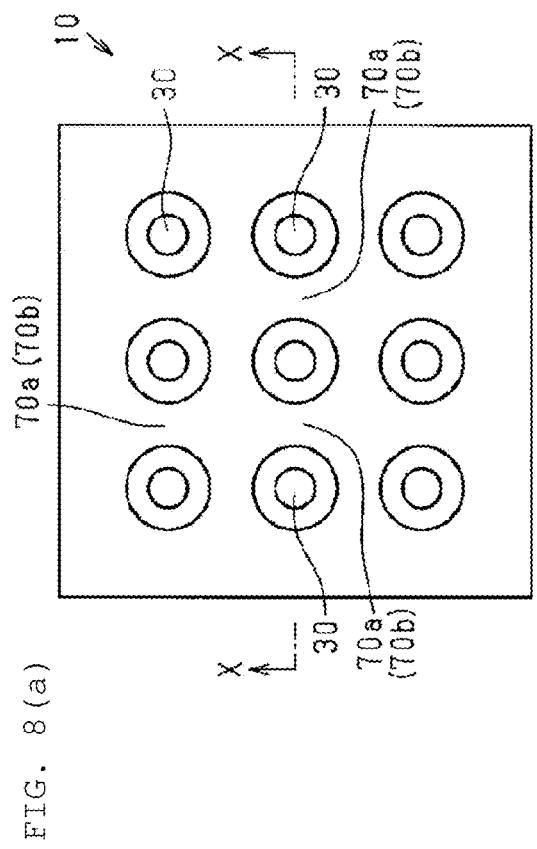
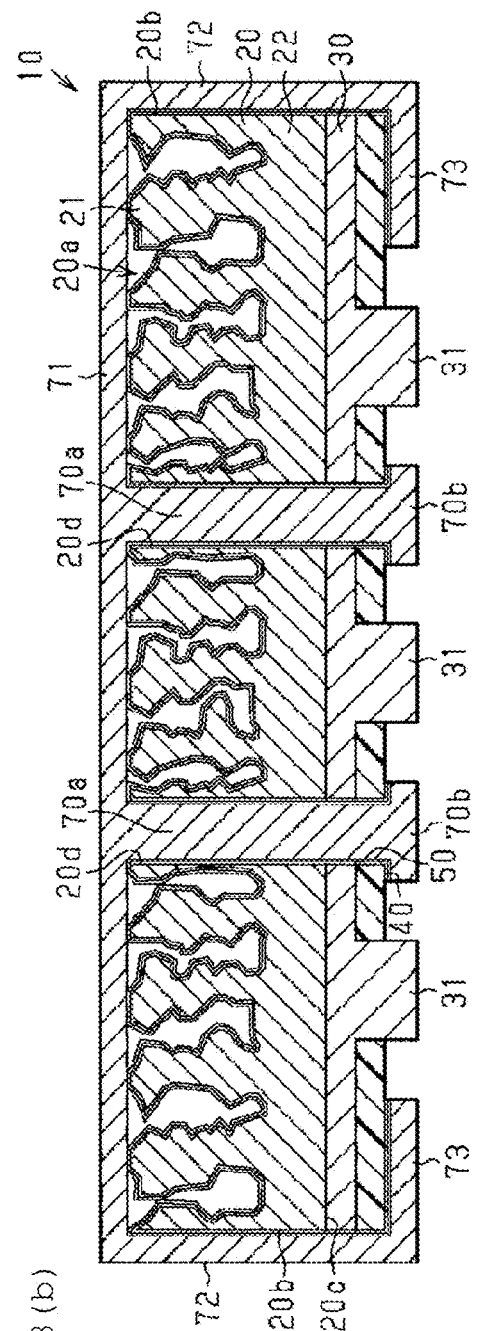
FIG. 8(a)
FIG. 8(b)

CAPACITOR AND CAPACITOR MOUNTING CONFIGURATION

CROSS REFERENCE TO RELATED APPLICATIONS

The present application is a continuation of International application No. PCT/JP2017/040775, filed Nov. 13, 2017, which claims priority to Japanese Patent Application No. 2016-223415, filed Nov. 16, 2016, the entire contents of each of which are incorporated herein by reference.

FIELD OF THE INVENTION

The present invention relates to capacitors and capacitor mounting configurations.

BACKGROUND OF THE INVENTION

Conventionally, capacitors employing conductive metal base members with porous configurations in order to provide larger capacitances are known (refer to Patent Document 1, for example).

The capacitor in Patent Document 1 includes a conductive metal base member, a dielectric layer formed on the conductive metal base member, an upper-portion electrode on the dielectric layer, a first terminal electrode electrically connected to the conductive metal base member, and a second terminal electrode electrically connected to the aforementioned upper-portion electrode. Further, the conductive metal base member is structured to include a high-porosity portion with a relatively-higher porosity, and a low-porosity portion with a lower porosity than that of the high-porosity portion around the high-porosity portion.

Patent Document 1: WO2015/118901

SUMMARY OF THE INVENTION

The capacitors described above are made to include the low-porosity portion in order to ensure sufficient mechanical strength. However, since they include the low-porosity portion, there is a possibility that a sufficient capacitance cannot be ensured.

The present invention has been made in order to overcome the aforementioned problem and aims at providing a capacitor and a capacitor-mounting configuration which enable increasing the capacitance while ensuring sufficient mechanical strength.

A capacitor provided for overcoming the aforementioned problem includes a conductive metal base member including a porous portion in a first main surface thereof; a dielectric layer entirely covering the first main surface and entirely covering side surfaces disposed along a direction orthogonal to the first main surface; an electrode layer covering the dielectric layer; a first terminal electrode covering a second main surface of the conductive metal base member opposite the first main surface; a second terminal electrode covering the electrode layer; and an insulation layer insulating the electrode layer and the conductive metal base member from each other.

With this structure, the dielectric layer, the electrode layer and the second terminal electrode are structured in such a way as to cover the first main surface and the side surfaces, while the first terminal electrode is structured in such a way as to cover the second main surface, so that the respective main surfaces and the side surfaces of the capacitor are covered with any of the terminal electrodes. This can ensure high mechanical strength. Further, since the porous portion is provided in the first main surface, the first main surface can be made to form the porous portion in its entirety, rather than forming a low-porosity portion at a portion thereof as in conventional structures. This can increase the capacitance.

In the aforementioned capacitor, preferably, the dielectric layer is provided in such a way as to cover a portion of the second main surface, in addition to the entire first main surface and the entire side surfaces disposed along the direction orthogonal to the first main surface, the electrode layer is provided in such a way as to entirely cover the dielectric layer, and the second terminal electrode is provided in such a way as to entirely cover the electrode layer.

With this structure, the dielectric layer, the electrode layer and the second terminal electrode are provided in such a manner as to cover a portion of the second main surface. Therefore, on the second main surface, there are provided the first terminal electrode and the second terminal electrode. This can provide a capacitor having the second terminal electrode on the first main surface and the first terminal electrode on the second main surface, as well as having the second terminal electrode and the first terminal electrode on the second main surface. This can improve the usability.

In the aforementioned capacitor, preferably, the first terminal electrode includes a plurality of terminal portions on the second main surface of the conductive metal base member.

With this structure, since the first terminal electrode includes the plurality of terminal portions on the second main surface of the conductive metal base member, it is possible to realize a lower inductance.

In the aforementioned capacitor, preferably, the conductive metal base member includes a through hole penetrating from the first main surface to the second main surface, and the second terminal electrode is provided in such a way as to extend from the first main surface to the second main surface through the through hole in the conductive metal base member.

With this structure, since the second terminal electrode can be extended to the second main surface through the through hole, it is possible to provide a capacitor having the second terminal electrode on the first main surface and the first terminal electrode on the second main surface, as well as having the second terminal electrode and the first terminal electrode on the second main surface. This can improve the usability.

In the aforementioned capacitor, preferably, the conductive metal base member is provided with a plurality of the through holes, and the second terminal electrode is provided in such a way as to extend from the first main surface to the second main surface through the respective through holes in the conductive metal base member.

With this structure, the second terminal electrode can be provided with the plurality of terminal portions on the second main surface, which can realize a lower inductance.

In some certain aspects, the conductive metal base member is constituted by a one-piece member including the porous portion and a supporting portion for supporting this porous portion at least from a lower side thereof. With this structure, the conductive metal base member can be prepared by cutting a parent material for the conductive metal base member.

In some certain aspects, the conductive metal base member is constituted by an etched metal foil, the first main surface of the conductive metal base member is constituted by an etched surface, and the second main surface of the conductive metal base member is constituted by a non-etched surface opposite from the etched surface. With this structure, the conductive metal base member can be prepared by performing etching on a single surface of a metal foil.

In some certain aspects, the conductive metal base member is constituted by a porous sintered metal block formed from a plurality of metal grains having been sintered. With this structure, the conductive metal base member can be prepared by performing heat treatment on metal grains.

In some certain aspects, the porous sintered metal block includes a fine pore formed by a neck between the metal grains adjacent to each other. With this structure, it is possible to control the porosity of the conductive metal base member, by changing or adjusting the type of the metal grains and/or the heat treatment conditions.

In some certain aspects, the capacitor includes a substrate for supporting a lower portion of the porous sintered metal block from a lower side. With this structure, the porous sintered metal block which functions as the conductive metal base member can be prepared by performing heat treatment on a plurality of metal grains on the substrate.

In some certain aspects, the substrate includes a cavity, and the porous sintered metal block is housed in the cavity and is supported from the lower side and side portions by the substrate. With this structure, the porous sintered metal block which functions as the conductive metal base member can be prepared by performing heat treatment on a plurality of metal grains within the cavity in the substrate. Further, the conductive metal base member can be supported from a lower side and side portions by the substrate.

In some certain aspects, the substrate is constituted by a flat-plate shaped substrate having a flat surface and having no cavity, the porous sintered metal block is supported from a lower side by the flat surface of the substrate, and the capacitor further includes a metal-plated layer for covering the substrate and for supporting the porous sintered metal block from the side portions. With this structure, the porous sintered metal block which functions as the conductive metal base member can be prepared by performing heat treatment on a plurality of metal grains on the flat surface of the substrate. Further, the conductive metal base member can be supported from a lower side by the substrate and can be supported from the side portions by the metal-plated layer.

A capacitor mounting configuration for overcoming the aforementioned problem is adapted to mount the aforementioned capacitor on a surface of a circuit board.

With this structure, it is possible to provide any or all of the aforementioned effects.

A capacitor mounting configuration for overcoming the aforementioned problem is adapted to place any of the aforementioned capacitors in such a way as to embed the capacitor in a circuit board.

With this structure, it is possible to provide any or all of the aforementioned effects.

With the capacitor and capacitor mounting configuration according to the present invention, it is possible to provide an effect of increasing the capacitance while ensuring high mechanical strength.

BRIEF EXPLANATION OF THE DRAWINGS

FIGS. 3(a) and 3(b) are cross-sectional views for illustrating a method for fabricating the capacitor.

FIG. 8(a) is a plan view of a capacitor in a second example of modification, and FIG. 8(b) is a cross-sectional view taken along a line X-X in FIG. 8(a).

DETAILED DESCRIPTION OF THE INVENTION

Hereinafter, capacitors according to respective embodiments will be described with reference to the accompanying drawings. Incidentally, in the accompanying drawings, components may be illustrated in an enlarged manner, for ease of understanding, in some cases. Further, the dimension ratios between the components may be different from the actual dimension ratios or the dimension ratios in other drawings, in some cases.

Figure 1:
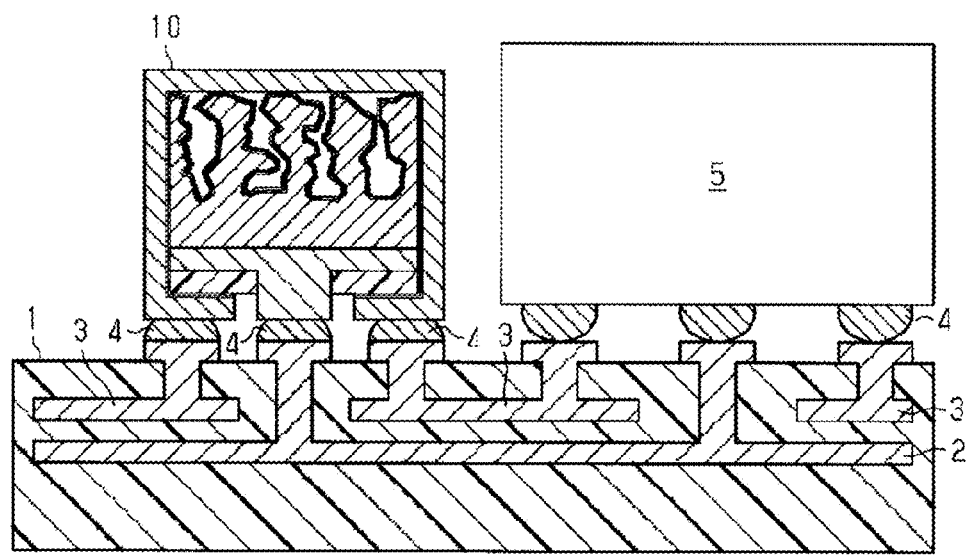
FIG. 1 is a cross-sectional view for illustrating a mounting configuration for mounting a capacitor according to an embodiment on a circuit board.

As illustrated in FIG. 1, a capacitor 10 according to the present embodiment is provided on the surface of a circuit board 1 and is electrically connected to a power-source layer 2 and GND layers 3 which are provided in the circuit board 1. As the connecting method therefor, for example, the connection is performed through soldering (for example, solder connection portions 4 in FIG. 1). Further, in the present embodiment, there is provided an integrated circuit 5 on the circuit board 1. The integrated circuit 5 is electrically connected to the aforementioned power-source layer 2 and the aforementioned GND layers 3. Namely, the capacitor 10 and the integrated circuit 5 are connected to the same circuit.

Figure 2:
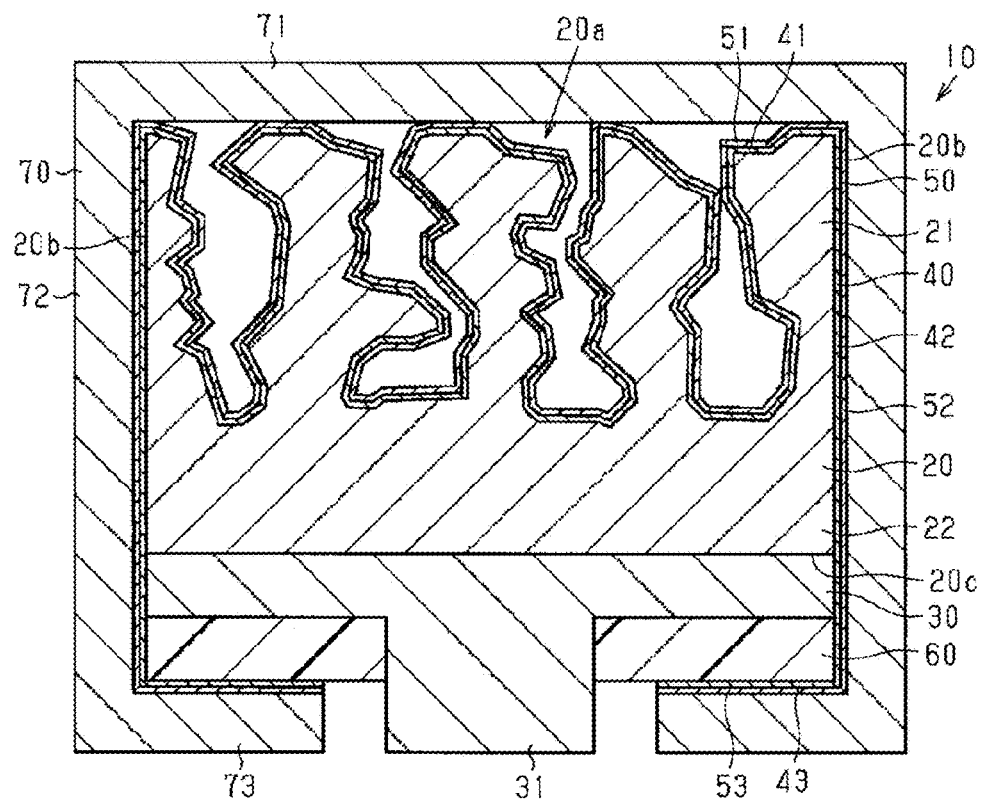
FIG. 2 is a cross-sectional view of the capacitor according to the embodiment.

As illustrated in FIG. 2, the capacitor 10 includes a conductive metal base member 20, a first extended electrode 30, a dielectric layer 40, an electrode layer 50, an insulation layer 60, and a second extended electrode 70. Further, the capacitor 10 according to the present embodiment is structured in such a manner as to have a substantially rectangular-parallelepiped shape. Further, it is assumed that "substantially rectangular-parallelepiped shapes" include rectangular-parallelepiped shapes which are chamfered at their corner portions or their ridge portions, and rectangular-parallelepiped shapes which are rounded at their corner portions or their ridge portions.

As illustrated in FIG. 2, the conductive metal base member 20 includes a porous portion 21 with a porous configuration in its first main surface side and also includes a supporting portion 22 in its second main surface side. Further, in FIG. 2, the first main surface is the upper surface, while the second main surface is the lower surface.

The material forming the conductive metal base member 20 is not particularly limited, provided that it is a metal and, for example, it is possible to employ aluminum, tantalum, nickel, copper, titanium, niobium and iron, alloys such as stainless steels, duralumin, and the like. Preferably, aluminum is employed as the material forming the conductive metal base member 20.

The porous portion 21 has a porous configuration with a higher porosity than that of the supporting portion 22. Further, in the present specification, the term "porosity" refers to the ratio of the area or the volume which is occupied by vacancies in the conductive metal base member 20 and, preferably, refers to the ratio of the area thereof. This porosity can be determined in the following way.

At first, the conductive metal base member 20 is worked into a thin piece with a thickness of 60 nm or less, through focused ion beam (FIB) working. This thin piece sample is photographed in a predetermined region (3 micrometers×3 micrometers) therein, using a transmission electron microscope (TEM). The resultant image is subjected to image analyses, in order to determine the area over which the metal in the conductive metal base member 20 exists. Further, the porosity can be determined according to the following formula.

The porosity=((the determined area−the area over which the metal in the base member exists)/the determined area)×100

Further, the vacancies in the porous portion 21 can be finally filled with non-base-member materials such as the dielectric layer 40 and the electrode layer 50, which are different from the conductive metal base member 20, during the process for fabricating the capacitor 10, but the aforementioned "porosity" is calculated in such a manner as to regard such filled portions as vacancies, without considering the materials filled therein.

The first extended electrode 30 is provided on the supporting portion 22 in the conductive metal base member 20, more specifically on a main surface 20c, which is the surface of the supporting portion 22. The material forming the first extended electrode 30 is not particularly limited, but it is possible to employ metals such as Au, Pb, Ag, Sn, Ni, and Cu, alloys thereof, conductive polymers, and the like. In the present embodiment, the first extended electrode 30 is formed through Cu plating, for example.

The first extended electrode 30 has a substantially plate shape and includes at least one protruding portion 31, preferably a plurality of protruding portions 31, which protrude from the center of the first extended electrode 30 in such a direction as to get further away from the supporting portion 22 (in the downward direction in FIG. 2). The protruding portions 31 are terminal portions which are electrically connected to the circuit board 1 (see FIG. 1) through the solder connection portions 4.

The dielectric layer 40 includes a first dielectric layer 41 which covers first main surface 20a of the conductive metal base member 20, a second dielectric layer 42 which covers side surfaces 20b, and a third dielectric layer 43 which covers a portion of the second main surface 20c.

The first dielectric layer 41 is structured in such a way as to cover the porous portion 21 entirely over the main surface 20a. The second dielectric layer 42 is structured in such a way as to extend from the end portions of the first dielectric layer 41 toward the main surface 20c in the opposite side and is structured in such a way as to entirely cover the side surfaces 20b. The third dielectric layer 43 is structured in such a way as to extend from the end portions of the second dielectric layer 42 toward the center to cover a portion of the main surface 20a. Further, there is provided the insulation layer 60 between the third dielectric layer 43 and the first extended electrode 30.

The material forming the dielectric layer 40 is not particularly limited provided that it has an insulating property, and it is preferable to employ metal oxides such as $AlO_x$ (for example, $Al_2O_3$), $SiO_x$ (for example, $SiO_2$), $AlTiO_x$, $SiTiO_x$, $HfO_x$, $TaO_x$, $ZrO_x$, $HfSiO_x$, $ZrSiO_x$, $TiZrO_x$, $TiZrWO_x$, $TiO_x$, $SrTiO_x$, $PbTiO_x$, $BaTiO_x$, $BaSrTiO_x$, $BaCaTiO_x$, $SiAlO_x$; metal nitrides such as $AlN_x$, $SiN_x$, $AlScN_x$; or metal oxynitrides such as $AlO_xN_y$, $SiO_xN_y$, $HfSiO_xN_y$, $SiC_xO_yN_x$. It is preferable to employ $AlO_x$, $SiO_x$, $SiO_xN_y$, $HfSiO_x$. Incidentally, the aforementioned formulas merely express the structures of the materials and do not restrict their compositions. Namely, "x", "y" and "z" attached to O and N can be any values larger than 0 (zero), and the ratios of the respective elements existing therein, including metal elements, can be appropriately set.

The dielectric layer 40 is preferably formed through a gas phase method, such as vacuum deposition, a chemical vapor deposition (CVD) method, sputtering, an atomic layer deposition (ALD) method, pulsed laser deposition (PLD) or the like. It is preferable to employ an ALD method, since it enables forming a layer (film) having a more uniform thickness even at fine portions of the fine pores in the porous member.

The electrode layer 50 is formed on the dielectric layer 40. More specifically, it includes a first electrode layer 51 provided on the first dielectric layer 41, a second electrode layer 52 provided on the second dielectric layer 42, and a third electrode layer 53 provided on the third dielectric layer 43.

The material forming the electrode layer 50 is not particularly limited, provided that it has conductivity, and it is preferable to employ Ni, Cu, Al, W, Ti, Ag, Au, Pt, Zn, Sn, Pb, Fe, Cr, Mo, Ru, Pd, Ta, alloys thereof such as CuNi, AuNi, AuSn, for example, metal oxides and metal oxynitrides such as TiN, TiAlN, TiON, TiAlON, TaN, conductive polymers (for example, PEDOT (poly (3,4-ethylene dioxythiophene)), polypyrrole, polyaniline) and the like. It is preferable to employ TiN and TiON.

The electrode layer 50 can be also formed through an ALD method. By employing an ALD method, it is possible to make the capacitor have a larger capacitance. As other methods, it is also possible to form the electrode layer 50, through a chemical vapor deposition (CVD) method, plating, bias sputtering, a Sol-Gel method, conductive polymer filling or other methods, which enable coating the dielectric layer to substantially fill the fine pores in the conductive metal base member. Preferably, a conductive film can be formed on the dielectric layer through an ALD method and, on the conductive film, a conductive material, preferably a material with a smaller electric resistance, can be deposited to fill the fine pores, through a different method, to form the electrode layer 50. With this structure, it is possible to efficiently provide a higher capacitance density and a lower equivalent series resistance (ESR).

The insulation layer 60 is provided between the conductive metal base member 20 and the electrode layer 50. By providing the insulation layer 60, it is possible to suppress short-circuits (shorts) between the electrode layer 50 and the conductive metal base member 20. The material forming the insulation layer 60 is not particularly limited provided that it has an insulation property, but it is preferable to employ a material having heat resistance, in cases of employing an atomic layer deposition method thereafter. As the insulation material forming the insulation layer 60, it is preferable to employ various types of glass materials, ceramic materials, polyimide resins, or fluororesins. In the present example, $SiO_2$ is employed as the insulation layer 60.

The second extended electrode 70 is formed on the electrode layer 50. More specifically, the second extended electrode 70 includes an upper-portion extended electrode portion 71 provided on the first electrode layer 51, a side-surface extended electrode portion 72 provided on the second electrode layer 52, and a lower electrode portion 73 provided on the third electrode layer 53. The material forming the second extended electrode 70 is not particularly limited, and it is possible to employ metals such as Au, Pb, Ag, Sn, Ni, Cu, alloys thereof, conductive polymers and the like. In the present embodiment, the second extended electrode 70 is formed through Cu plating, for example.

Next, there will be described processes for fabricating (a method for fabricating) the capacitor 10 having the aforementioned structure.

As illustrated in FIG. 3(a), at first, a conductive metal substrate 100 is prepared. As the material forming the conductive metal substrate 100, it is possible to employ, for example, aluminum, tantalum, nickel, copper, titanium, niobium and iron, and alloys such as stainless steels and duralumin. Preferably, aluminum is employed as the material forming the conductive metal substrate 100. The conductive metal substrate 100 includes a porous metal layer 101 in its first main-surface side and, further, includes a supporting layer 102 in its second main-surface side. Namely, one surface of the conductive metal substrate 100 is formed by the porous metal layer 101, and the surface of the conductive metal substrate 100 which is opposite from the aforementioned one surface is formed by the supporting layer 102.

On the supporting layer 102 in the conductive metal substrate 100, a conductive layer 103 has been preliminarily formed through Cu sputtering. On the conductive layer 103, there are provided a plurality of insulation portions 104 formed through vapor deposition or sputtering, and coating portions 105 formed through coating between the respective insulation layers 104.

As illustrated in FIG. 3(b), the conductive metal substrate 100 and the insulation portions 104 are cut. In the present embodiment, they are cut between the coating portions 105 to form a plurality of piece portions 110. Each of the piece portions 110 resulting from the cutting includes a conductive metal base member 20 and an insulation layer 60 in the capacitor 10, as a result of the cutting.

Figure 4:
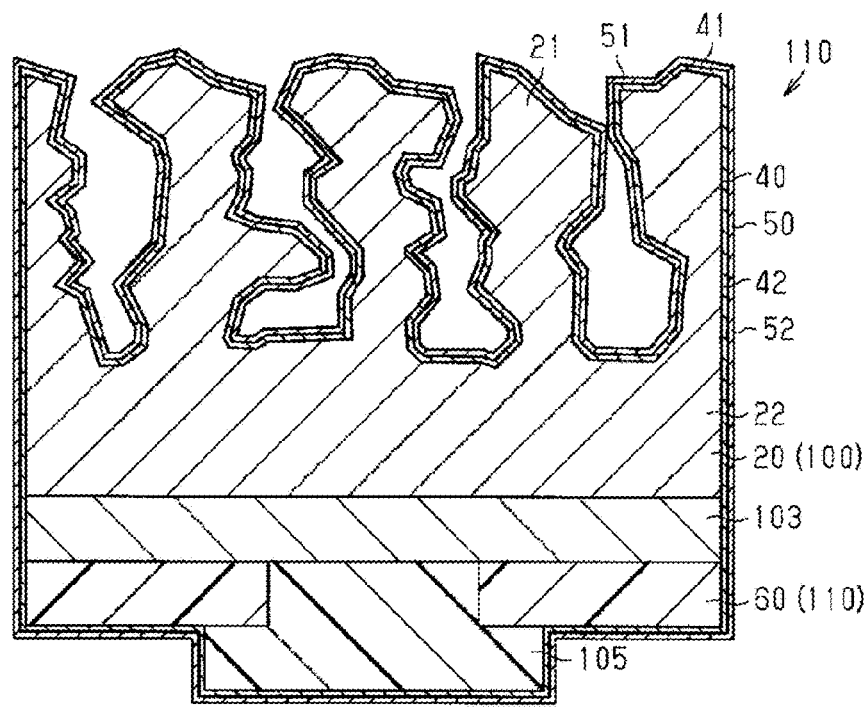
FIG. 4 is a cross-sectional view for illustrating the method for fabricating the capacitor.

As illustrated in FIG. 4, on each of the piece portions 110, a dielectric layer 40 is formed and, thereafter, an electrode layer 50 is formed through the ALD method each. At this time, the respective layers 40 and 50 are deposited even on the insulation layer 60 and the coating portion 105.

Subsequently, for example, a Ti/Cu-sputtered film is formed as pre-process for forming electrodes (not illustrated). At this time, the film is formed on the first electrode layer 51 and the second electrode layer 52 in the electrode layer 50.

Figure 5:
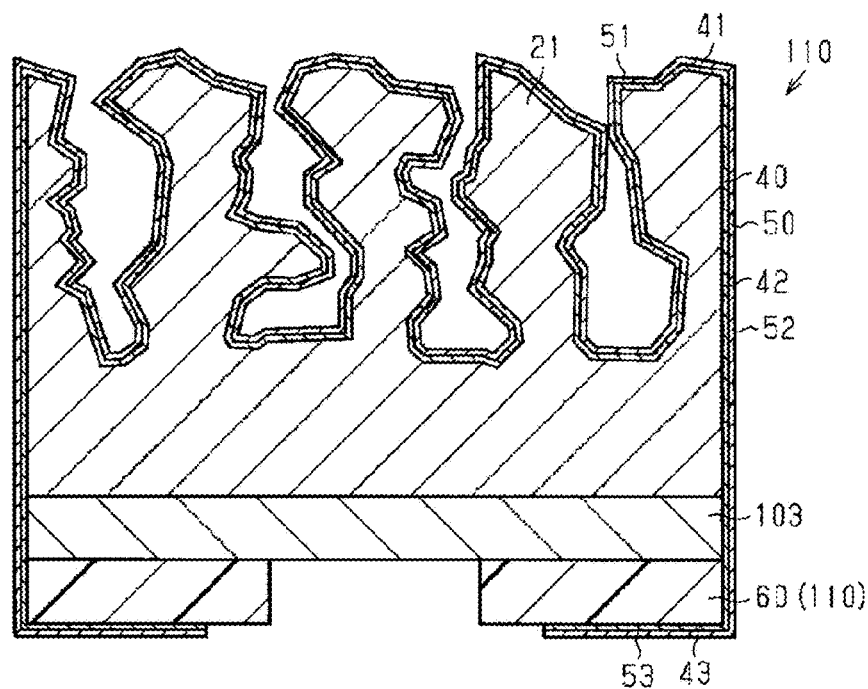
FIG. 5 is a cross-sectional view for illustrating the method for fabricating the capacitor.

As illustrated in FIG. 5, the coating portion 105 is removed. The method for removing the coating portion 105 is not restricted, and it is possible to employ a method for removing it through laser treatment or chemical treatment, for example.

Subsequently, for example, a Ti/Cu-sputtered film is formed as pre-process for forming electrodes (not illustrated). At this time, the film is formed on the third electrode layer 53 in the electrode layer 50.

Thereafter, a first extended electrode 30 (protruding portions 31) and a second extended electrode 70 are formed through Cu plating. Thus, the second extended electrode 70 is formed in such a way as to cover the first electrode layer 51, the second electrode layer 52 and the third electrode layer 53, and the protruding portions 31 in the first extended electrode 30 are formed.

According to the present embodiment which has been described above, it is possible to provide effects and advantages as follows.

The dielectric layer, the electrode layer and the first terminal electrode are structured in such a way as to cover the first main surface 20a and the side surfaces 20b, while the second terminal electrode is structured in such a way as to cover the second main surface 20c, so that the respective main surfaces and the side surfaces of the capacitor are covered with any of the terminal electrodes. This can ensure high mechanical strength. Further, since the porous portion is provided in the first main surface, the first main surface can be made to form the porous portion in its entirety, rather than forming a low-porosity portion at a portion thereof as in conventional structures. This can increase the capacitance.

The dielectric layer, the electrode layer and the first terminal electrode are provided in such a manner as to cover a portion of the second main surface. Therefore, on the second main surface, there are provided the first terminal electrode and the second terminal electrode. This can provide a capacitor usable in any of cases of using the first terminal electrode on the first main surface and the second terminal electrode on the second main surface and cases of using the first terminal electrode and the second terminal electrode on the second main surface. This can improve the usability.

Since the dielectric layer 40 is formed through an atomic layer deposition method (ALD method), the dielectric layer 40 can be made to have a uniform thickness.

Since the electrode layer 50 is formed through an atomic layer deposition method (ALD method), the electrode layer 50 can be made to have a uniform thickness.

Since the dielectric layer 40 and the electrode layer 50 can be continuously formed using an atomic layer deposition method (ALD method), it is possible to improve the productivity.

EXAMPLES OF MODIFICATIONS

Further, the aforementioned embodiment can be also implemented in the following manners which properly make changes therein.

Although, in the aforementioned embodiment, the capacitor 10 includes the third dielectric layer 43 covering a portion of the main surface 20c, the third electrode layer 53 covering the third dielectric layer 43, and the lower electrode portion 73 covering the third electrode layer 53, the present invention is not limited thereto.

Figure 6:
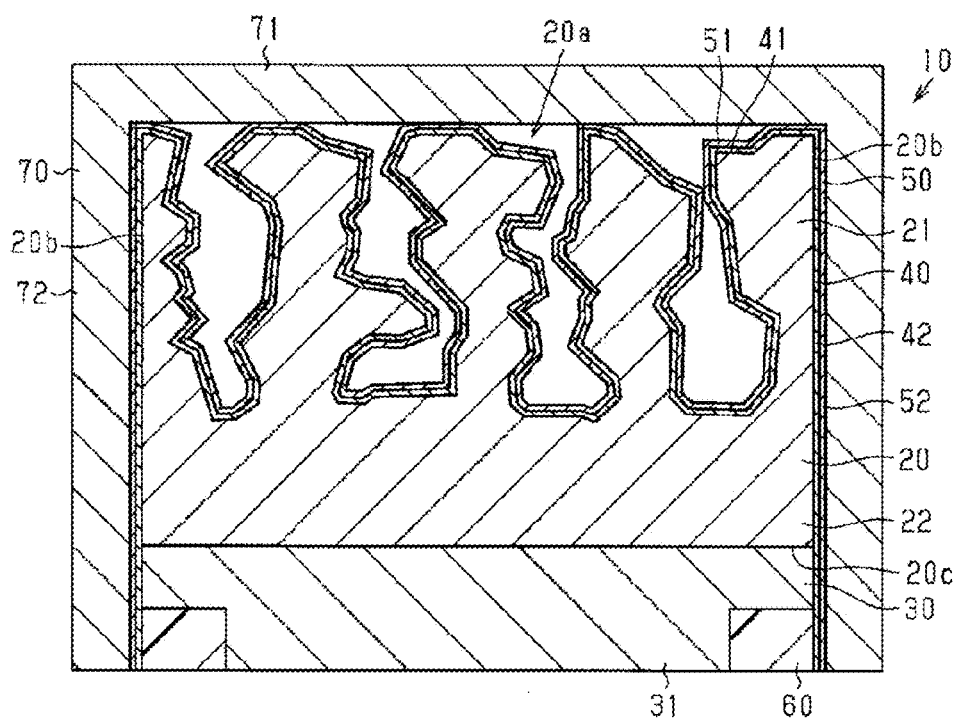
FIG. 6 is a cross-sectional view of a capacitor in a first example of modification.
Figure 7:
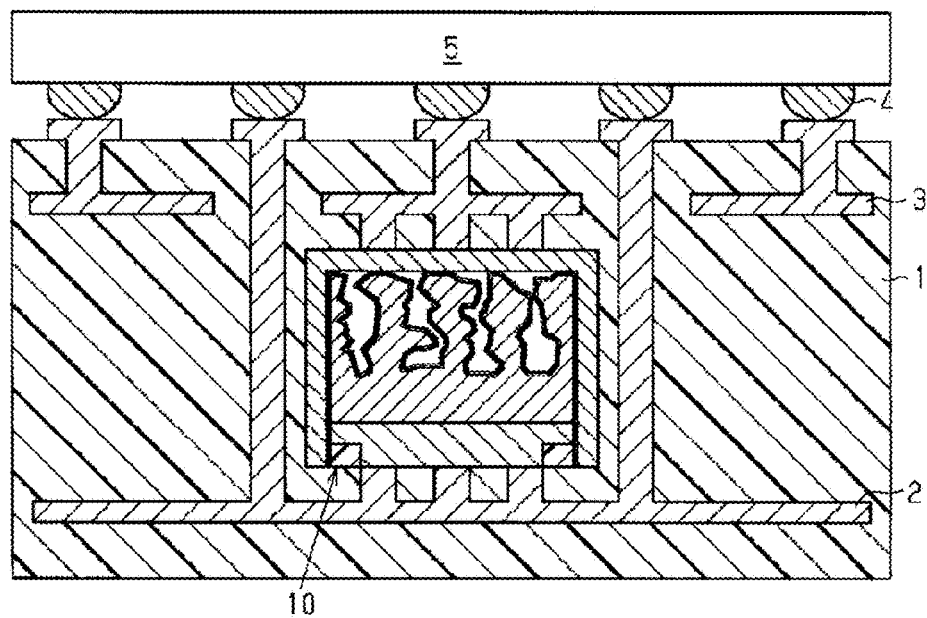
FIG. 7 is a cross-sectional view for illustrating a mounting configuration for mounting the capacitor in the first example of modification on a circuit board.

As illustrated in FIG. 6 and FIG. 7, in a capacitor 10 in a first example of modification, a dielectric layer 40 includes a first dielectric layer 41 and a second dielectric layer 42. An electrode layer 50 includes a first electrode layer 51 and a second electrode layer 52. A second extended electrode 70 includes an upper-portion extended electrode portion 71 and a side-surface extended electrode portion 72. Namely, none of the dielectric layer 40, the electrode layer 50 and the second extended electrode 70 covers the main surface 20c. Further, in FIG. 6 and FIG. 7, the first extended electrode 30 includes protruding portions 31 shaped to have a larger width in comparison with the aforementioned embodiment.

Further, in the structure illustrated in FIG. 7, the capacitor 10 is placed in such a way as to be embedded in a circuit board 1. The capacitor 10 of this structure can also ensure sufficient strength since the second extended electrode 70 in the capacitor 10 is structured to cover the first main surface 20a and the entire side surfaces 20b, and the first extended electrode 30 is structured to cover the second main surface 20c, thereby suppressing the occurrences of fractures and the like of the capacitor 10. Further, the capacitor 10 illustrated in FIG. 6 can be also mounted on the surface, similarly to the aforementioned embodiment, rather than being placed in such a way as to be embedded.

Further, it is also possible to provide a lower electrode portion 73, while eliminating a third dielectric layer 43 and a third electrode layer 53. Namely, the dielectric layer 40 and the electrode layer 50 can be structured to cover the entire first main surface 20a and the entire side surfaces 20b which are disposed along the direction orthogonal to the main surface 20a, and the second extended electrode 70 can be structured to cover the entire first main surface 20a, the entire side surfaces 20b disposed along the direction orthogonal to the main surface 20a, and a portion of the second main surface 20c.

As in a capacitor 10 in a second example of modification illustrated in FIGS. 8(a) and 8(b), a first extended electrode 30 can also have a plurality of protruding portions 31 to form a multi-terminal configuration. Instead thereof or in addition thereto, a second extended electrode 70 can similarly have protruding portions 70a to form a multi-terminal configuration. The protruding portions 70a in the second extended electrode 70 are structured to extend toward the second main surface 20c from an upper-portion extended electrode portion 71. In this case, a conductive metal base member 20 is provided with a plurality of through holes 20d. Further, the protruding portions 70a in the second extended electrode 70 are structured such that the tip ends 70b of the protruding portions 70a are exposed from the through holes 20d, in the state of being placed within the through holes 20d. The tip ends 70b of the protruding portions 70a are preferably made to be flush with the protruding portions 31.

Figure 9:
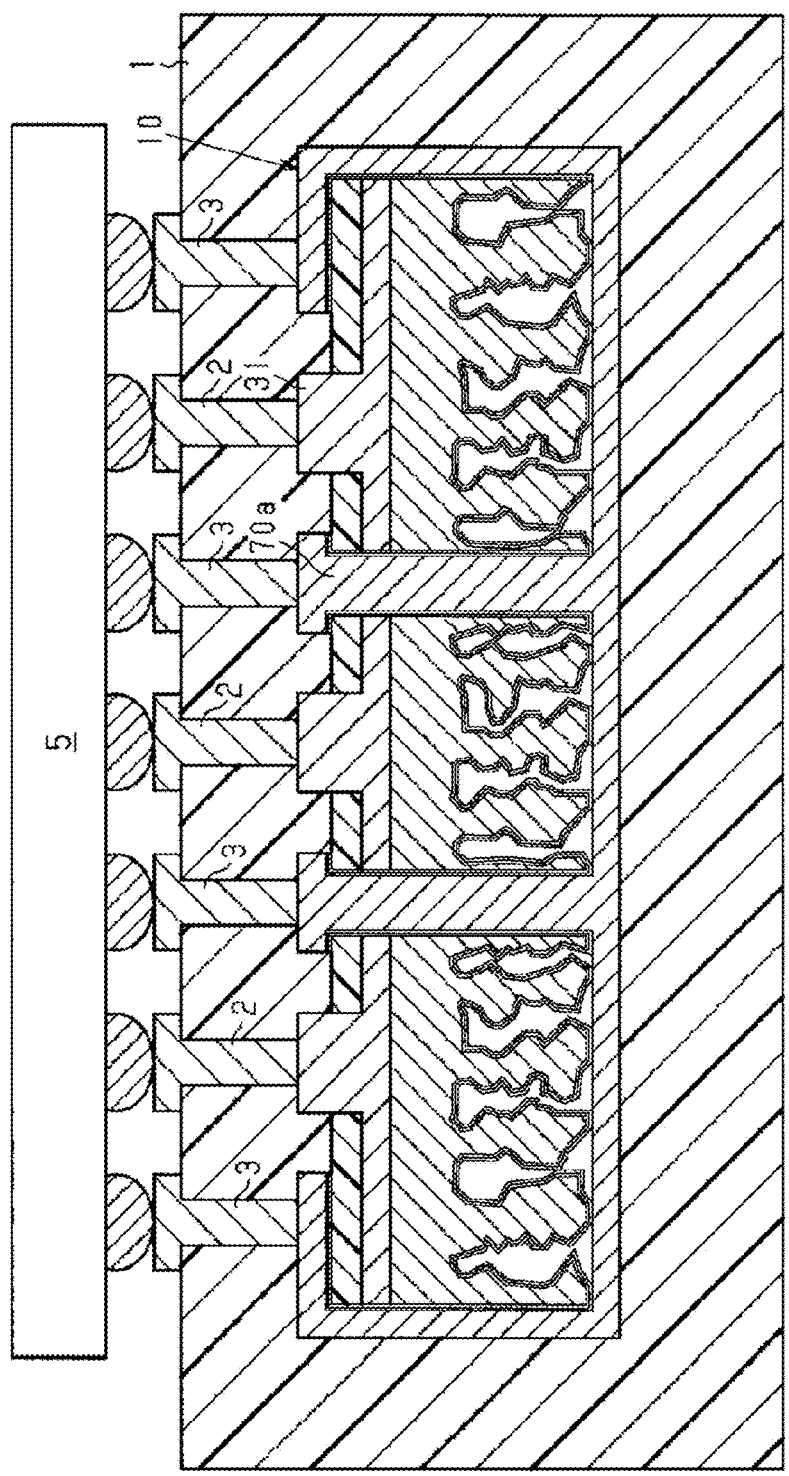
FIG. 9 is a cross-sectional view for illustrating a mounting configuration for mounting the capacitor in the second example of modification on a circuit board.

Further, in the case of placing the capacitor 10 in the second example of modification illustrated in FIGS. 8(a) and 8(b) in such a way as to embed it in a circuit board 1, it is possible to contrive a structure illustrated in FIG. 9. Namely, the capacitor 10 is placed in such a way as to be embedded in the circuit board 1, in a state where power-source layers 2 in the circuit board 1 and the protruding portions 31 are electrically connected to each other, and GND layers 3 in the circuit board 1 and the protruding portions 70a are electrically connected to each other.

Further, the capacitor 10 illustrated in FIGS. 8(a) and 8(b) can be also mounted on the surface, similarly to the aforementioned embodiment, rather than being placed in such a way as to be embedded.

Figure 10A:
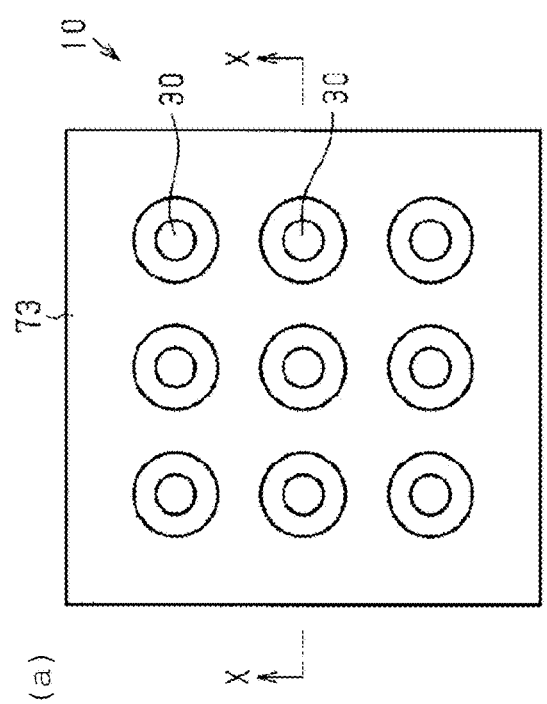
FIG. 10(a) is a plan view of a capacitor in a third example of modification.
Figure 10B:
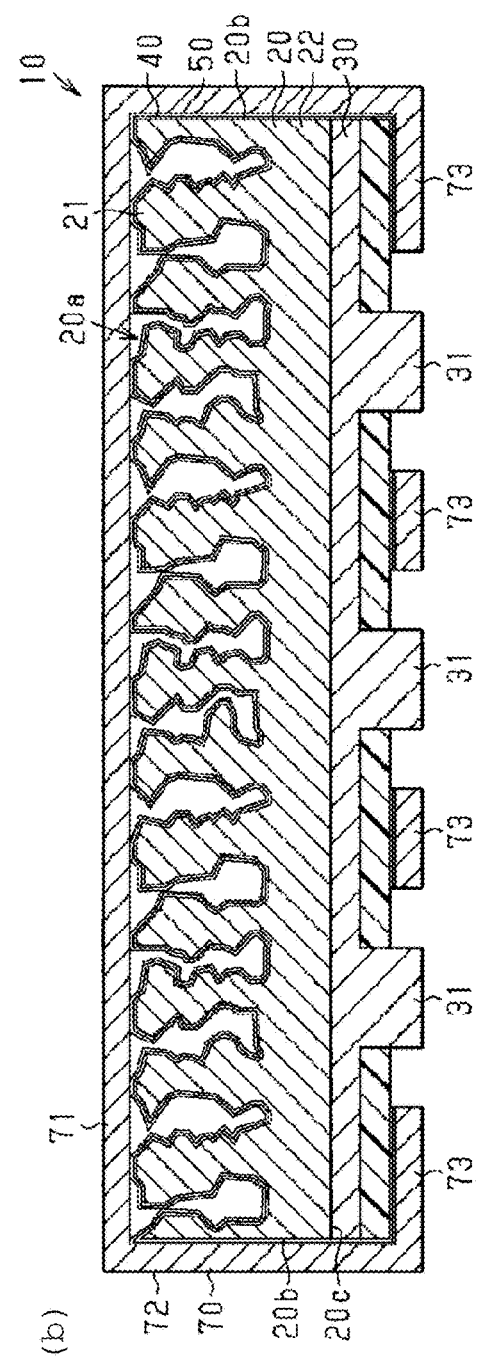
FIG. 10(b) is a cross-sectional view taken along a line X-X in FIG. 10(a).

Further, as in a capacitor 10 according to a third example of modification illustrated in FIGS. 10(a) and 10(b), only a first extended electrode 30 can be provided with a plurality of protruding portions 31 to form a multi-terminal configuration. Namely, protruding portions 70a in a second extended electrode 70 can be eliminated. In this case, lower electrode portions 73 in the second extended electrode 70 are structured to cover the peripheries of the protruding portions 31.

By providing the plurality of protruding portions 31 to form the multi-terminal configuration as described above, it is possible to realize a lower inductance. Further, by providing the plurality of the protruding portions 70a or by providing the lower electrode portions 73 structured to cover the peripheries of the protruding portions 31, it is possible to utilize the capacitor having a multi-terminal configuration, which can realize a lower inductance.

In the aforementioned embodiment, the capacitor 10 is made to have a substantially rectangular-parallelepiped shape, but the shape thereof is not limited thereto. The shape of the capacitor can be also a circular shape, an elliptical shape or other shapes when being viewed in a plan view.

The porous portion 21 in the conductive metal base member 20 according to the embodiment can be fabricated by performing etching on a metal foil such as an aluminum foil, for example. However, the conductive metal base member 20 is not limited to such an etched metal foil. For example, as will be described with reference FIGS. 11 to 15, it is also possible to employ a metal grain aggregate (which is also referred to as a porous sintered metal block) fabricated through thermal treatment as a conductive metal base member.

Figure 11:
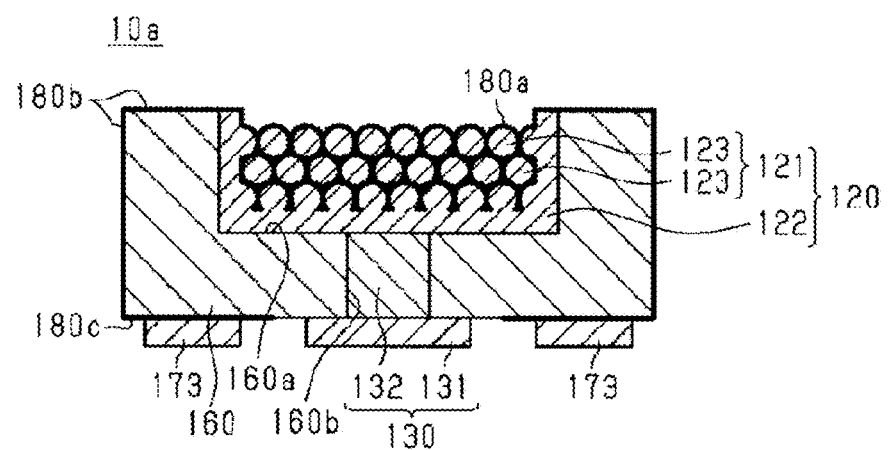
FIG. 11 is a schematic cross-sectional view of a capacitor in a fourth example of modification.
Figure 12:
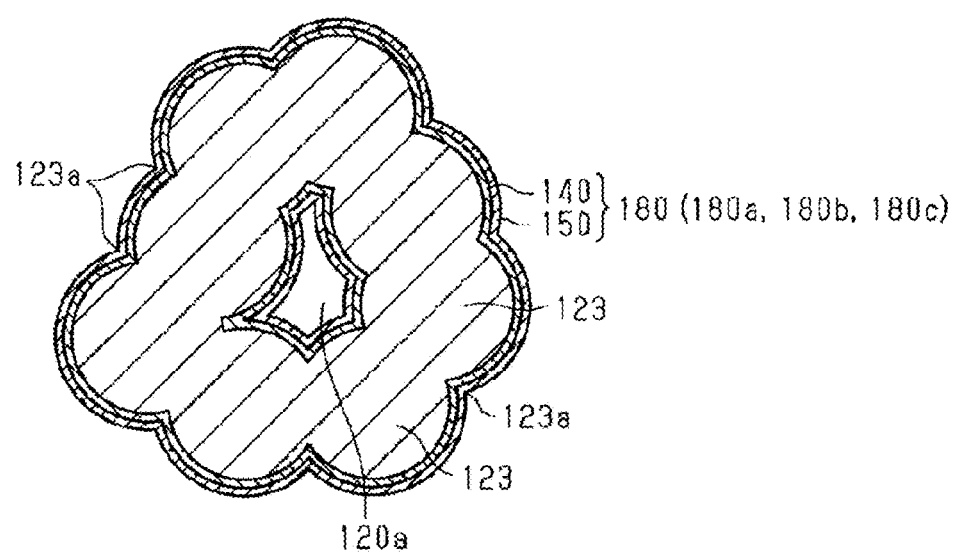
FIG. 12 is a schematic enlarged view of a conductive metal base member in the capacitor in FIG. 11.
Figure 13A:
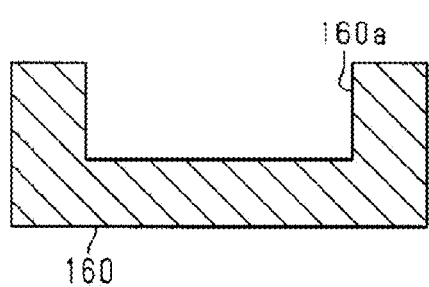
FIGS. 13(a) to 13(f) are cross-sectional views for illustrating a method for fabricating the capacitor in FIG. 11.
Figure 13B:
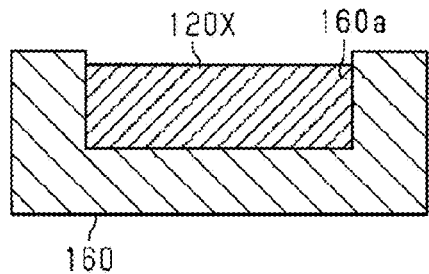
Figure 13C:
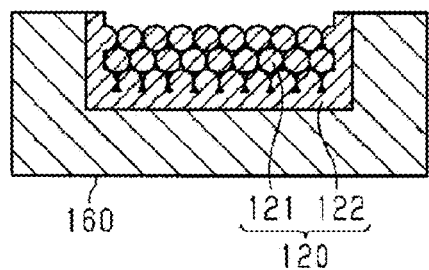
Figure 13D:
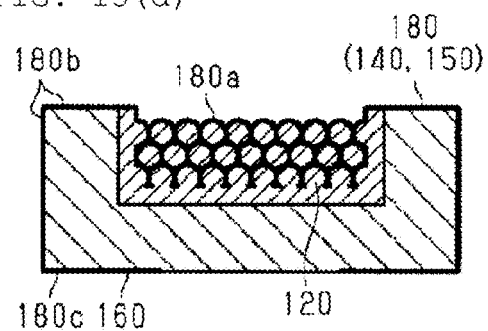
Figure 13E:
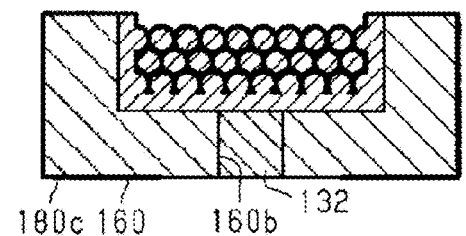
Figure 13F:
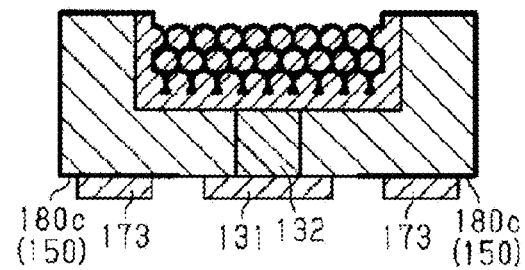
Figure 14:
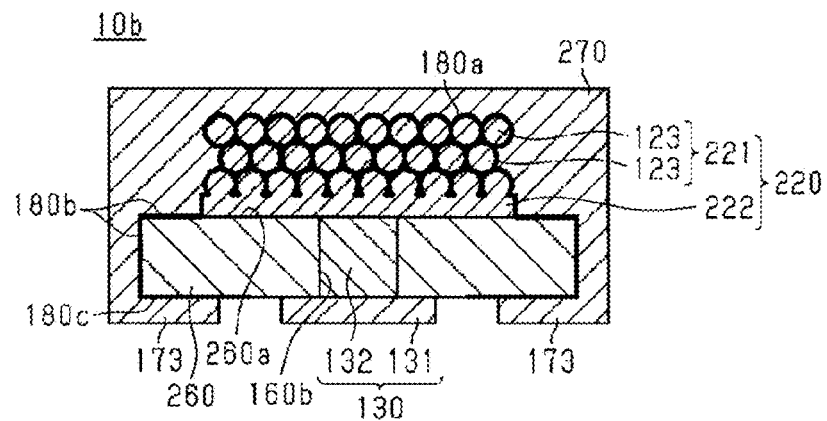
FIG. 14 is a schematic cross-sectional view of a capacitor in a fifth example of modification.
Figure 15A:
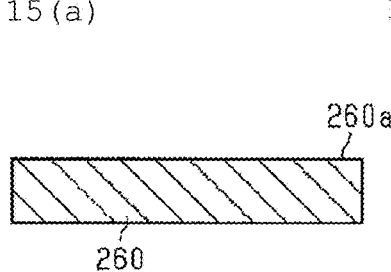
FIGS. 15(a) to 15(f) are cross-sectional views for illustrating a method for fabricating the capacitor in FIG. 14.
Figure 15B:
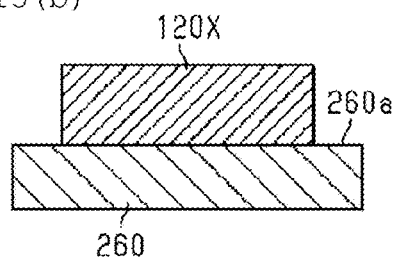
Figure 15C:
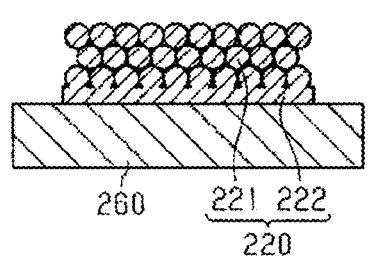
Figure 15D:
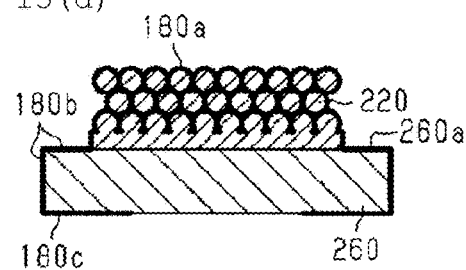
Figure 15E:
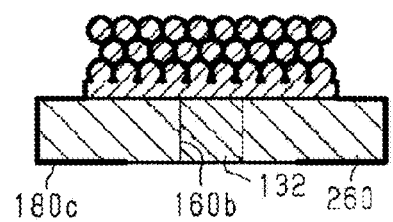
Figure 15F:
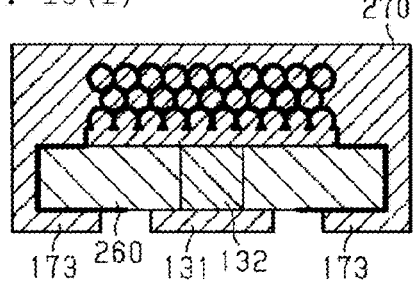

A capacitor 10a in a fourth example of modification illustrated in FIG. 11 includes a silicon substrate 160, which is a substrate having a cavity 160a, and a conductive metal base member 120 housed within the cavity 160a in the silicon substrate 160. As illustrated in FIG. 12, the conductive metal base member 120 is structured to be an aggregate of metal grains 123 (porous sintered metal block). As the metal grains 123, the metal used in the conductive metal base member 20 in the embodiment can be employed. The metal grains 123 in the fourth example of modification are constituted by nickel grains. The average grain size of the metal grains 123 is set according to the type of the metal grains 123 and the capacitance characteristics of the capacitor 10a and can be selected out of the range of 50 to 500 nm, for example. Between the metal grains 123 adjacent to each other, there are formed necks 123a. A single neck 123a or two or more necks 123a connected to each other form a fine pore 120a. A plurality of fine pores 120a are dispersed over the entire aggregate of the metal grains 123 and are preferably distributed substantially uniformly therein. Accordingly, a major part or preferably the entirety of the aggregate of the metal grains 123 forms the high-porosity portion or the porous portion 121.

Out of the aggregate of the metal grains 123, the portion which comes in contact with the inner surfaces (namely the bottom surface and/or the side surfaces) of the cavity 160a can function as a supporting portion 122 for supporting the porous portion from the lower side and/or the side portions. The supporting portion 122 can form a non-porous portion or a low-porosity portion like a foil-shaped sintered metal portion which spreads in close contact with the inner surfaces of the cavity 160a.

The aggregate of the metal grains 123 can be made to include a foil-shaped sintered metal portion which comes in contact or close contact with the entire inner surfaces of the cavity 160a. This foil-shaped sintered metal portion is formed by performing heat treatment on the metal grains 123 within the cavity 160a, in order to form the aggregate of the metal grains 123. The necks 123a and/or the fine pores 120a in the aggregate of the metal grains 123 can be also faced to the inner surfaces of the cavity 160a.

Next, there will be described the conduction between the conductive metal base member 120 and a first terminal electrode 131 and a second terminal electrode 173 in the capacitor 10a.

The first terminal electrode 131 and the second terminal electrode 173 in the capacitor 10a are placed on the same flat surface (for example, the lower surface) of the capacitor 10a. The silicon substrate 160 includes at least one via hole 160b which extends from the lower surface of the silicon substrate 160 to the cavity 160a. The via hole 160b is filled with a via electrode 132 formed through metal plating, for example. The lower surface (for example, the supporting portion 122) of the conductive metal base member 120 is conductively connected to the first terminal electrode 131 in the capacitor 10a, through the via electrode 132.

As illustrated in FIG. 12, the aggregate of the metal grains 123 is covered with a layer-laminated film 180 constituted by a dielectric layer 140 and an electrode layer 150, except the lower surface (for example, the supporting portion 122) of the aggregate of the metal grains 123 which comes in contact with the inner surfaces of the cavity 160a. The dielectric layer 140 is in direct contact or close contact with the metal grains 123. The dielectric layer 140 coats the metal grains 123 completely over the metal surface of the metal grains 123, namely in such a way as not to expose the metal surface. The electrode layer 150 coats the dielectric layer 140.

The dielectric layer 140 is sandwiched between the electrode layer 150 and the metal grains 123.

As illustrated in FIG. 11, the layer-laminated film 180 (the dielectric layer 140 and the electrode layer 150) extends from the conductive metal base member 120 to the lower surface of the capacitor 10a through the outer surfaces of the silicon substrate 160. The layer-laminated film 180 includes a porous-portion coating portion 180a coating the porous portion 121, a portion 180b coating the upper surface and the side surfaces of the silicon substrate 160, and an electrode seat portion 180c which is a portion coating a portion of the lower surface of the silicon substrate 160, wherein the second terminal electrode 173 is formed on the electrode seat portion 180c. These portions 180a, 180b and 180c are continuous with each other without interruption.

The dielectric layer 140 is in direct contact or close contact with the silicon substrate 160. The electrode layer 150 coats the dielectric layer 140. Accordingly, the electrode layer 150 does not come in contact with the upper surface, the side surfaces and the lower surface of the silicon substrate 160. The second terminal electrode 173 is provided, for example, directly on the electrode layer 150, on the electrode seat portion 180c in the layer-laminated film 180 which coats the lower surface of the silicon substrate 160. The first terminal electrode 131 and the second terminal electrode 173 in the capacitor 10a are connected to a circuit board 1 through solder connection portions 4 (FIG. 1), for example.

There will be described a method for fabricating the capacitor 10a in the fourth example of modification, with reference to FIGS. 13(a) to 13(f).

In a process a, a silicon substrate 160 provided with a cavity 160a is prepared.

In a process b, a paste 120x containing metal grains 123 (nickel grains) is deposited or embedded within the cavity 160a. This paste 120x can be prepared in a paste state by dispersing the metal grains 123 into a solvent such as ethanol, then adding a synthetic resin such as polyvinyl alcohol thereto and then mixing or kneading them.

Process c: The silicon substrate 160 and the paste 120x are subjected to heat treatment at a predetermined temperature (300 to 400 degrees C. in the fourth example of modification), in a reducing atmosphere where nitrogen ($N_2$) and hydrogen ($H_2$) are flowed. Through the heat treatment, the metal grains 123 are sintered, which forms necks 123a between the metal grains 123 adjacent to each other, thereby forming a conductive metal base member 120 having a porous portion 121. Further, through the heat treatment, the metal grains 123 are partially brought into close contact or surface-to-surface contact with the inner surfaces of the cavity 160a, thereby forming a supporting portion 122. The temperature and the time period of the heat treatment can be set or adjusted, according to the average grain size and the type of the metal of the metal grains 123, for example, such that the conductive metal base member 120 (particularly, the porous portion 121) has a desired porosity, such that the capacitor 10a has desired electric characteristics.

Process d: The conductive metal base member 120 and the silicon substrate 160 are coated with a layer-laminated film 180 (a dielectric layer 140 and an electrode layer 150). This coating includes a process for forming the dielectric layer 140 and a subsequent process for forming the electrode layer 150 on the dielectric layer 140. Preferably, the dielectric layer 140 and the electrode layer 150 are deposited through an ALD method. The dielectric layer 140 and the electrode layer 150 can be formed from and with the same materials and methods as those of the dielectric layer 40 and the electrode layer 50 according to the embodiment.

Process e: A via electrode 132 is formed in the silicon substrate 160. For example, the layer-laminated film 180 (the dielectric layer 140 and the electrode layer 150) is partially removed at the portion where the via should be formed, such that an electrode seat portion 180c in the layer-laminated film 180 is left on the lower surface of the silicon substrate 160. Then, a via hole 160b extending from the lower surface of the silicon substrate 160 to the cavity 160a is formed. Then, the via electrode 132 is formed in the via hole 160b through Cu plating, for example.

Process f: A metal-plated film is formed through Cu plating, for example, on the conductive surface exposed in the outermost surface. This metal-plated film constitutes a first terminal electrode 131 on the via electrode 132, and a second terminal electrode 173 on the electrode layer 150, on the electrode seat portion 180c in the layer-laminated film 180 which coats the lower surface of the silicon substrate 160.

Through the aforementioned series of the processes, the capacitor 10a in the fourth example of modification can be fabricated.

According to the fourth example of modification, it is possible to provide effects as follows, in addition to the effects described regarding the embodiment and the examples of modifications.

The conductive metal base member 120 having a desired porosity can be fabricated through relatively-simple heat treatment.

Since the conductive metal base member 120 can be fabricated within the cavity 160a in the silicon substrate 160, it is possible to minimize the ratio of the supporting portion 122 in the conductive metal base member 120, which enables forming the conductive metal base member 120 such that a major part or the entirety of the conductive metal base member 120 forms the porous portion 121. Accordingly, the capacitor in the fourth example of modification is advantageous in increasing the capacitance of the conductive metal base member 120.

The conductive metal base member 120 is housed within the cavity 160a in the silicon substrate 160, and the side surfaces of the conductive metal base member 120 are supported by the silicon substrate 160, which increases the mechanical strength of the capacitor 10a.

In the fourth example of modification, the via electrode 132 is connected to a local portion of the lower surface of the conductive metal base member 120. Accordingly, it is possible to reduce the electrode material (for example, copper), in comparison with the embodiment where the first extended electrode 30 is connected to the entire lower surface of the conductive metal base member 20.

With reference to FIG. 14 and FIGS. 15(a) to 15(f), there will be described a capacitor 10b in a fifth example of modification.

The capacitor 10b includes a silicon substrate 260 which is a flat-plate shaped substrate having a flat surface 260a and having no cavity, and a conductive metal base member 220 provided on the flat surface 260a in the silicon substrate 260. The conductive metal base member 220 is structured to be an aggregate of metal grains 123, similarly to the fourth example of modification illustrated in FIG. 12. Accordingly, a major part of the aggregate of the metal grains 123 forms a high-porosity portion or a porous portion 221. Out of the aggregate of the metal grains 123, the portion which comes in contact with the flat surface 260a in the silicon substrate 260 forms a supporting portion 222 for supporting the porous portion 221 from the lower side. The supporting portion 222 can form a non-porous portion or a low-porosity portion like a foil-shaped sintered metal portion which spreads in close contact with the flat surface 260a of the silicon substrate 260.

There are provided a dielectric layer 140, an electrode layer 150 and a via electrode 132, which are the same as those in the fourth example of modification.

A metal-plated film 270 is formed at the peripheries of the capacitor 10b, namely on the upper surface, the side surfaces and the lower surface thereof, similarly to the second extended electrode 70 according to the embodiment. The metal-plated film 270 seals and protects the conductive metal base member 220, the dielectric layer 140 and the electrode layer 150, on the silicon substrate 260. Out of the metal-plated film 270, the portion formed on the lower surface of the silicon substrate 260 functions as a first terminal electrode 131 and a second terminal electrode 173 in the capacitor 10b similarly to the fourth example of modification.

With reference to FIGS. 15(a) to 15(f), there will be described differences of a method for fabricating the capacitor 10b in the fifth example of modification from that of the fourth example of modification in FIGS. 13(a) to 13(f).

In a process a, a silicon substrate 260 with a flat-plate shape is prepared.

In a process b, a paste 120x containing metal grains 123 (nickel grains) is deposited on the flat surface 260a of the silicon substrate 260.

Processes c, d and e are the same as those in the fourth example of modification.

Process f: A metal-plated film 270 is formed through Cu plating, for example, on the conductive surface exposed in the outermost surface. The metal-plated film 270 forms a metal-plated film 270 which continuously covers, seals and protects the conductive metal base member 220 and the layer-laminated film 180. The metal-plated film 270 supports the conductive metal base member 220 from the side portions. A first terminal electrode 131 and a second terminal electrode 173 in the capacitor 10b are formed by some portions of the metal-plated film 270 formed on the lower surface of the silicon substrate 260.

Further, the metal-plated film 270 is formed after the thermal treatment (the process c) for forming the conductive metal base member (the porous sintered metal block) 220.

Through the aforementioned series of the processes, the capacitor 10b in the fifth example of modification can be fabricated.

According to the fifth example of modification, it is possible to provide effects as follows, in addition to the effects described regarding the embodiment and the examples of modifications.

In the fifth example of modification, the silicon substrate 260 with the flat-plate shape is employed and, therefore, the silicon substrate 260 can be obtained or prepared with a lower cost than those for silicon substrates with cavities.

The aforementioned embodiment and the aforementioned examples of modifications can be properly combined with each other.

In the aforementioned embodiment, the porous portion 21 in the conductive metal base member 20 may be referred to as the upper portion or the high-porosity portion of the conductive metal base member 20 in some cases. The supporting portion 22 in the conductive metal base member 20 may be referred to as the lower portion, the non-porous portion or the low-porosity portion of the conductive metal base member 20 in some cases.

The present disclosure includes the following structures. The reference characters of the components according to the embodiment are attached for facilitation of understanding rather than for restriction.

A capacitor (10; 10a; 10b) according to some aspects of the present invention includes a conductive metal base member (20; 120; 220) including a porous portion (21; 121; 221) and a supporting portion (22; 122; 222) for supporting the porous portion at least from a lower side, a first terminal electrode (30; 131) which is provided at a different position from that of the conductive metal base member (20; 120; 220) and is conducted to the supporting portion (22; 122; 222) in the conductive metal base member (20; 120; 220), a second terminal electrode (70; 173) which is provided at a different position from that of the conductive metal base member (20; 120; 220) and is conducted to the porous portion (21; 121; 221) in the conductive metal base member (20; 120; 220), and a layer-laminated film (40, 50; 140, 150) which covers at least the porous portion (21; 121; 221), and includes a dielectric layer (40; 140) and an electrode layer (50; 150) which covers the entire dielectric layer (40; 140), wherein the layer-laminated film (40, 50; 140, 150) includes a porous-portion coating portion (180a) for covering the metal surface of the porous portion (21; 121; 221), and an electrode seat portion (180c) which is different from the porous-portion coating portion (180a), wherein the second terminal electrode (70; 173) is formed thereon, the dielectric layer (40; 140) comes in close contact with the metal surface of the porous portion (21; 121; 221) in such a way as not to expose the metal surface of the porous portion (21; 121; 221), in the porous-portion coating portion (180a) in the layer-laminated film (40, 50; 140, 150), and the dielectric layer (40; 140) faces the second terminal electrode (70; 173) with the electrode layer (50; 150) interposed therebetween, in the electrode seat portion (180c) of the layer-laminated film (40, 50; 140, 150).

In some certain aspects, the porous-portion coating portion (180a) and the electrode seat portion (180c) in the layer-laminated film (40, 50; 140, 150) are continuous with each other without interruption.

In some certain aspects, the conductive metal base member (20) is a one-piece member (20) having an upper portion with a first predetermined height and a lower portion with a second predetermined height, wherein the entire upper portion has a higher porosity than that of the entire lower portion.

In some certain aspects, the conductive metal base member (20) is constituted by an etched metal foil including an etched surface adapted to function as the porous portion (21), and a non-etched surface opposite from the etched surface, wherein the non-etched surface functions as the supporting portion (22).

In some certain aspects, the conductive metal base member (120; 220) is constituted by a porous sintered metal block (120; 220) formed from a plurality of metal grains (123) having been sintered.

In some certain aspects, the porous sintered metal block (120; 220) includes fine pores (120a) formed by necks (123a) between the metal grains (123) adjacent to each other.

In some certain aspects, the capacitor (10a; 10b) includes a substrate (160; 260) for supporting the porous sintered metal block (120; 220) from a lower side, and the supporting portion (122; 222) includes a lower portion of the porous sintered metal block (120; 220) which supports the porous portion (121; 221) at least from a lower side and comes in contact with the substrate (160).

In some certain aspects, the substrate (160) has a cavity (160a), the porous sintered metal block (120) is housed within the cavity (160a) and is supported by the substrate (160) from the lower side and side portions.

In some certain aspects, the substrate (260) is a flat-plate shaped substrate (260) having a flat surface (260a) and having no cavity, the porous sintered metal block (220) is supported from a lower side by the flat surface (260a), and the capacitor (10b) further includes a metal-plated layer (270) for covering the substrate (260) and for supporting the porous sintered metal block (220) at its side portions.

DESCRIPTION OF REFERENCE SYMBOLS

1: Circuit board
10, 10a, 10b: Capacitor
20, 120, 220: Conductive metal base member
20a: Main surface (first main surface)
20b: Side surface
20c: Main surface (second main surface)
20d: Through hole
21, 121, 221: Porous portion
22, 122, 222: Supporting portion
30, 131: First extended electrode (first terminal electrode)
31: Protruding portion (the terminal portion of the first extended electrode)
40, 140: Dielectric layer
50, 150: Electrode layer
60: Insulation layer
70, 173: Second extended electrode (second terminal electrode)

The invention claimed is:

1. A capacitor comprising:
   a conductive metal base member including a porous portion in a first main surface thereof;
   a dielectric layer entirely covering the first main surface and entirely covering side surfaces disposed along a direction orthogonal to the first main surface;
   an electrode layer covering the dielectric layer;
   a first terminal electrode covering a second main surface of the conductive metal base member opposite the first main surface;
   a second terminal electrode covering the electrode layer; and
   an insulation layer insulating the electrode layer and the conductive metal base member from each other.

2. The capacitor according to claim 1, wherein the first terminal electrode includes at least one protruding portion which extends away from the conductive metal base member.

3. The capacitor according to claim 1, wherein the dielectric layer further covers a portion of the second main surface, the electrode layer entirely covers the dielectric layer, and the second terminal electrode entirely covers the electrode layer.

4. The capacitor according to claim 3, wherein the first terminal electrode includes a plurality of terminal portions on the second main surface of the conductive metal base member.

5. The capacitor according to claim 1, wherein the first terminal electrode includes a plurality of terminal portions on the second main surface of the conductive metal base member.

6. The capacitor according to claim 1, wherein the insulation layer is between the dielectric layer and the first terminal electrode.

7. The capacitor according to claim 1, wherein the conductive metal base member includes a through hole penetrating from the first main surface to the second main surface, and the second terminal electrode extends from the first main surface to the second main surface through the through hole in the conductive metal base member.

8. The capacitor according to claim 1, wherein the conductive metal base member includes a plurality of through holes penetrating from the first main surface to the second main surface, and the second terminal electrode extends from the first main surface to the second main surface through each of the plurality of through holes in the conductive metal base member.

9. The capacitor according to claim 1, wherein the conductive metal base member comprises a one-piece member including the porous portion and a supporting portion for supporting the porous portion at least from one side thereof.

10. The capacitor according to claim 1, wherein the conductive metal base member comprises an etched metal foil, the first main surface of the conductive metal base member comprises an etched surface, and the second main surface of the conductive metal base member comprises a non-etched surface opposite from the etched surface.

11. The capacitor according to claim 1, wherein the conductive metal base member comprises a porous sintered metal block.

12. The capacitor according to claim 11, wherein the porous sintered metal block includes a pore formed by a neck between adjacent metal grains.

13. The capacitor according to claim 11, wherein the capacitor includes a substrate supporting a lower portion of the porous sintered metal block.

14. The capacitor according to claim 13, wherein the substrate includes a cavity, and the porous sintered metal block is housed in the cavity and is supported from a lower side and side portions thereof by the substrate.

15. The capacitor according to claim 13, wherein the substrate comprises a flat-plate shaped substrate having a flat surface and having no cavity, the porous sintered metal block is supported from a lower side thereof by the flat surface of the substrate, and the capacitor further includes a metal-plated layer covering the substrate and supporting the porous sintered metal block from side portions thereof.

16. The capacitor according to claim 13, wherein the substrate includes a via hole and a via electrode in the via hole, the via electrode being connected to the first terminal electrode.

17. A capacitor mounting configuration comprising:
   a circuit board; and
   the capacitor according to claim 1 mounted on a surface of the circuit board.

18. A capacitor mounting configuration comprising:
   a circuit board; and
   the capacitor according to claim 1 embedded in the circuit board.

* * * * *